United States Patent [19]
Sato et al.

[11] Patent Number: 4,668,972
[45] Date of Patent: May 26, 1987

[54] MASTERSLICE SEMICONDUCTOR DEVICE

[75] Inventors: Shinji Sato, Atsugi; Gensuke Goto, Ebina, both of Japan

[73] Assignee: Fujitsu Limited, Kanagawa, Japan

[21] Appl. No.: 643,705

[22] Filed: Aug. 24, 1984

[30] Foreign Application Priority Data

Aug. 26, 1983 [JP] Japan .................. 58-155005

[51] Int. Cl.⁴ .......................................... H01L 27/04
[52] U.S. Cl. ................................. 357/42; 357/41; 357/45; 357/68
[58] Field of Search ................... 357/41, 45, 42, 68

[56] References Cited

U.S. PATENT DOCUMENTS
4,412,237 10/1983 Matsumura et al. ............... 357/41

FOREIGN PATENT DOCUMENTS
0080361 6/1983 European Pat. Off. .......... 357/45
57-100746 6/1982 Japan .............................. 357/45
58-139446 8/1983 Japan .............................. 357/42

OTHER PUBLICATIONS
Electronics International, vol. 56, No. 3, Feb. 1983, "Gate Array Needs Fewer Gates for RAM", C. Cohen, pp. 86-87.

*Primary Examiner*—William D. Larkins
*Attorney, Agent, or Firm*—Staas & Halsey

[57] ABSTRACT

A masterslice semiconductor device is provided, which reduces or eliminates unused transistors. In the basic cells of the masterslice semiconductor device, each transistor is formed as electrically independent from the others; i.e., each transistor has an individual gate electrode and has an individual region for the source and drain. Terminals formed in parallel to the gate channel of each transistor permits interconnection of the electrodes in a basic cell array using a straight wiring pattern. Such a straight interconnection reduces the effective number of wiring channels needed for a unit cell, and facilitates construction of a larger scale unit cell in a basic cell array.

10 Claims, 19 Drawing Figures

MASTERSLICE SEMICONDUCTOR DEVICE

BACKGROUND OF THE INVENTION

1. Field of the Invention

The present invention relates to a large scale integrated (LSI) semiconductor device and, more particularly, relates to an improvement in a basic cell of a masterslice semiconductor device, such as a gate array, fabricated with a large number of transistors arranged along both row and column directions of a semiconductor substrate.

2. Description of the Related Art

Masterslice semiconductor technology can provide custom-tailored large scale integrated semiconductor devices at a low cost and in a short turnaround time. That is, a large number of transistors and resistors, which are formed in a semiconductor substrate ahead of time, are interconnected using masks having wiring patterns which allow the devices to meet each customer's specific functional requirements. In the masterslice semiconductor device, transistors are usually arranged in a number of unit groups called basic cells each having an identical pattern. An exemplary basic cell configuration and a circuit formed from the basic cells are disclosed in U.S. Pat. No. 4,412,1237 to Matsumura et al, issued Oct. 25, 1983.

FIG. 1 is a plan view of the general arrangement of a bulk pattern of a gate array. As illustrated in FIG. 1, on a semiconductor substrate chip 100, the basic cells BC are arranged in columns as basic cell arrays $BL_1$, $BL_2$, ... $BL_n$. Each of the basic cells BC is, in general, at least a pair of p-channel and n-channel MIS (Metal Insulator Semiconductor) transistors (which will be referred to as p-channel and n-channel transistors hereinafter). The column shaped basic cell arrays are arranged with a predetermined space therebetween. At the periphery of the chip 10, is a pad region which includes pads PD, each used as a terminal to an external circuit. An input/output region is set aside for input/output cells I/O, each including an input/output circuit. The space between each adjacent basic cell array is usually used for distributing wiring lines interconnecting the basic cells located in the same basic cell arrays or between basic cell arrays.

FIG. 2 is a plan view of a bulk pattern in a prior art basic cell. In FIG. 2, sources and drains of p-channel transistors QP1 and QP2 are formed in a p-type region 1, and sources and drains of the n-channel transistors QN1 and QN2 are formed in an n-type region 2. A polysilicon gate electrode 3G1, which extends along one of the gate channels in each p-type region 1 and n-type region 2, forms a single common gate for the p-channel transistor QP1 and n-channel transistor QN1, while the polysilicon gate electrode 3G2, which extends along another gate channel in each p-type region 1 and n-type region 2, forms a single common gate for the p-channel transistor QP2 and n-channel transistor QN2. P-type contact region 4CP and n-type contact region 4CN are used to keep all portions of the semiconductor substrate chip at a specified potential.

FIG. 3 is an equivalent circuit diagram of the circuit in the basic cell shown in FIG. 2. The basic cell is a pair of p-channel transistors QP1 and QP2, and a pair of n-channel transistors QN1 and QN2, each pair having a common gate.

A number of such basic cells, as illustated in FIGS. 2 and 3, are arranged in columns on a semiconductor chip, to form basic cell arrays, as illustrated in FIG. 1. The basic cells are interconnected using double-layer aluminum metallization technology, resulting in a desired LSI circuit network.

In the masterslice semiconductor device, the LSI circuit network is formed from a number of elementary circuit blocks, including 2-input NAND gates, 2-input NOR gates and/or flip-flop circuits as well as other elementary circuits. Each of the elementary circuits is created using a single or a plurality of the basic cells shown in FIGS. 2 and 3. The area occupied by the basic cells forming each elementary circuit is referred to as a unit cell. When some types of unit cells are produced, such as a RAM (Random Access Memory), a transmission gate circuit or a clocked gate circuit using the basic cells as shown in FIGS. 2 and 3, frequently one or more transistors in the basic cells are left unused. For example, conventionally, four of the basic cells, as shown in FIG. 2, are used to form a single 8-transistor RAM cell. However, only half of the total 16 transistors in the four basic cells are effectively utilized, and the other half of the transistors are left unused, inactive and, thus, wasted. With respect to a transmission gate circuit, two transmission gate circuits can be formed from one of the conventional basic cells, however, the circuits cannot operate independently, and, therefore, except in some special applications, one of the two transmission gates is frequently redundant. In a clocked gate circuit created using two basic cells, half of the eight transistors in the two conventional basic cells are left unused and inactive. The occurrence of the above-discussed redundant transistors reduces the integration density of the LSI circuit network on the masterslice semiconductor chip.

SUMMARY OF THE INVENTION

It is an object of the present invention to provide a masterslice which permits various types of unit cells to be constructed without leaving redundant or unused transistors in the basic cells.

It is another object of the present invention to provide a masterslice semiconductor device having a higher integration density when compared with that of conventional masterslice semiconductor devices.

It is a further object of the present invention to provide basic cells which can be interconnected without using wiring channels running between basic cell arrays.

It is an additional object of the present invention to provide independent transistors within each basic cell.

The above objects can be accomplished by forming the basic cell using a transistor having a gate electrode where at least one end extends into a terminal portion capable of contacting wiring lines running thereover. The extended terminal region is positioned so that the wiring lines can also pass over the source or drain regions of other transistors arranged in line with the subject transistor using a straight wiring line. This structure of the terminal portion increases the variety in the layout of possible connections to the gate electrode. That is, the connecting point can be selected from newly provided wiring channels, and a number of wiring lines can be laid out across the unselected portions. As a result, it is easy to connect the gate of a transistor to the source or drain regions of other transistors arranged in line with the transistor, without using the wiring lines distributed in the spaces between adjacent basic cell arrays (see FIG. 1). The basic cell is also provided with independently operable transistors. Due to the extended terminal portion of the gate electrode and the electrical independence of each transistor from the others in the basic cell, the occurrence of redundant transistors can be eliminated. Accordingly, the effective integration density of transistors in a masterslice LSI semiconductor device can be substantially increased.

The present invention also includes a configuration of a basic cell which comprises first and second pairs of p-channel and n-channel transistors accompanied by a pair of additional p-channel transistors and a pair of additional n-channel transistors, wherein the transistors in each of the additional pairs are formed in parallel to each other and adjacent to the longitudinal ends of the first and second transistor pairs. Using this basic cell, an 8-transistor RAM (Random Access Memory) cell can be created, without any redundant transistors resulting.

These, together with other objects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 4:
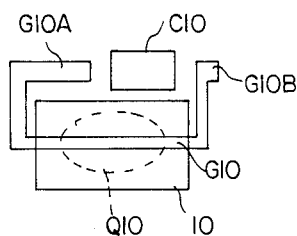
FIG. 4 is a bulk pattern of a fundamental basic cell structure according to the present invention.

FIG. 4 is a plan view illustrating a bulk pattern of a basic cell structure according to the present invention. The gate electrode G10 of the MIS transistor Q10, whose source and drain are formed in the p-type (or n-type) region 10, extends along the periphery of the region 10 to form the terminal portion G10A. The terminal G10A is aligned parallel with the portion of gate electrode G10 over the transistor gate channel. The other end or the gate electrode G10 is provided with a terminal G10B having a tab. A contact region C10 supplies the semiconductor substrate with a specified potential. A number of such basic cells can be arranged in a line in a column direction and form a basic cell array.

Figure 5A:
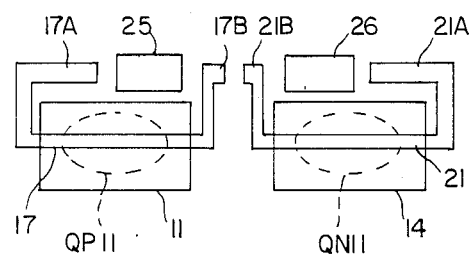
FIG. 5(a) is a bulk pattern of a modified basic cell configuration according to the present invention.

FIG. 5(a) is a plan view illustrating a bulk pattern of a modified basic cell configuration according to the present invention. The basic cell shown in FIG. 5(a) comprises a pair of transistors that include a p-channel transistor QP11 and an n-channel transistor QN11. The source and drain of each of the transistors QP11 and QN11 are formed in the p-type region 11 and the n-type region 14. One end of the gate electrode 17 of the p-channel transistor QP11 extends along the left side periphery of the p-type region 11 to the terminal portion 17A, while one end of the gate electrode 21 of the n-channel transistor QN11 extends along the right side periphery of the n-type region 14 to the terminal portion 21A. The terminal portions 17A and 21A extend parallel to the portions of the gate electrodes 17 and 21 passing over the source and drain regions of the transistors. The other ends of each of the gate electrodes 17 and 21, respectively, extends to the terminal portions 17B and 21B which face each other with a tab. The reference characters 25 and 26, respectively, designate an n-type and a p-type substrate contact region.

Figure 5B:
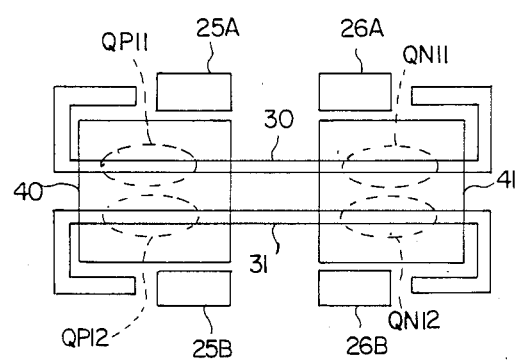
FIG. 5(b) is a bulk pattern of another modified basic cell configuration according to the present invention.

FIG. 5(b) is a plan view illustrating a bulk pattern of another modified basic cell according to the present invention. The basic cell shown in FIG. 5(b) comprises two pairs of p-channel and n-channel transistors, the first pair comprising a p-channel transistor QP11 and an n-channel transistor QN11, and the second pair comprising a p-channel transistor QP12 and an n-channel transistor QN12. The transistor pair QP11 and QN11 have a common gate 30, the p-channel and n-channel transistors QP12 and QN12 have a common gate 31, and the pairs form a common source or drain in the p-type region 40 or n-type region 41, respectively. Each pair of transistors includes two extended gate terminal portions as in FIG. 5(b). The n-type contact regions 25A and 25B and the p-type contact regions 26A and 26B provide the same function as similar substrate contacts in the preceding embodiments.

Figure 6:
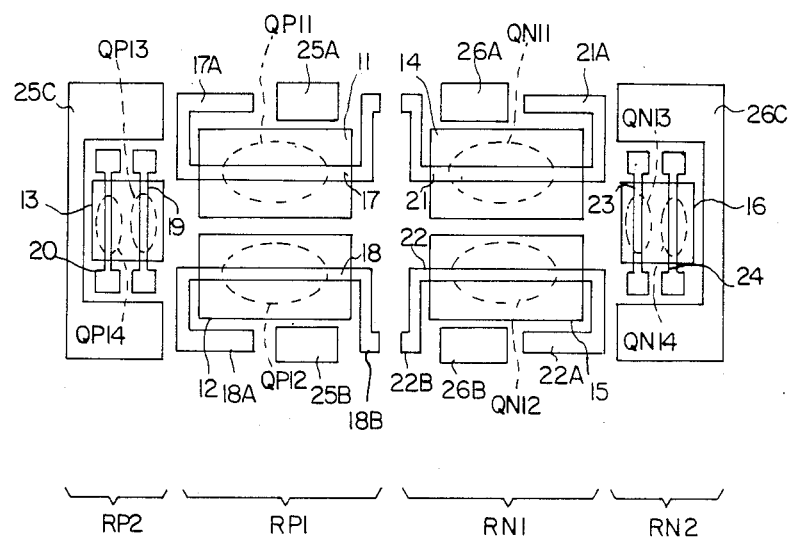
FIG. 6 is a bulk pattern of a further modified basic cell configuration according to the present invention.

FIG. 6 is a plan view illustrating a bulk pattern of another modified basic cell configuration according to the present invention. The basic cell of FIG. 6 is a practical configuration based on the basic cell of FIG. 5(a). This basic cell includes a first pair of transistors including p-channel transistor QP11 and n-channel transistor QN11, a second pair of transistors including p-channel transistor QP12 and n-channel transistor QN12, a third pair of p-channel transistors QP13 and QP14, and a fourth pair of N-channel transistors QN13 and QN14.

The p-channel transistor QP12 and n-channel transistor QN12 in the second pair are respectively formed adjacently to and in parallel with the corresponding p-channel transistor QP11 and n-channel transistor QN11 of the first pair. The sources and drains of the p-channel transistor QP12 and n-channel transistor QN12, respectively, occupy the associated p-type region 12 and n-type region 15. As in the first pair, one end of the gate electrode 18 of the p-channel transistor QP12 extends along the periphery of the p-type region 12 to the terminal portion 18A, and one end of the gate electrode 22 of the n-channel transistor QN12 extends along the periphery of the n-type region 15 to the terminal portion 22A. Other ends of the gate electrodes 18 and 22 extend to the terminal portions 18B and 22B which face each other with tabs. The gate terminal portions 18A and 22A are extended to provide additional contact formation area. Once again, n-type contact regions 25A and 25B and p-type contact regions 26A and 26B supply the semiconductor substrate with a specified potential.

The additional p-channel transistors QP13 and QP14 are formed adjacent to each other and the sources and drains are formed in the p-type region 13, and form a single common source or drain. The respective gate electrodes 19 and 20 of the transistors QP13 and QP14 are parallel to each other and perpendicular to the longitudinal directions of both of the first and the second transistor pairs. The additional n-channel transistors QN13 and QN14 are arranged symmetric to the p-channel transistors. N-type contact region 25C and p-type contact region 26C are provided for the same purpose as the contact regions 25A, 25B, 26A and 26B. RP1 and RP2, respectively, designate the first and second p-channel transistor regions, and RN1 and RN2, respectively, designate the first and second n-channel transistor regions. The positions of the additional p-channel transistors QP13 and QP14 and the additional n-channel transistors QN13 and QN14 with respect to the first and second transistor pairs may be interchanged if the type of the contact region 25C and 26C is also interchanged.

Figure 1:
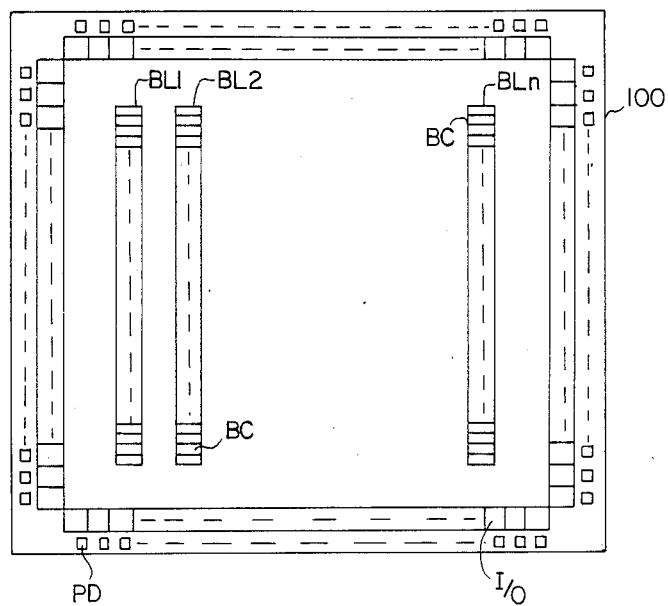
FIG. 1 is a bulk pattern diagram of a gate array.
Figure 2:
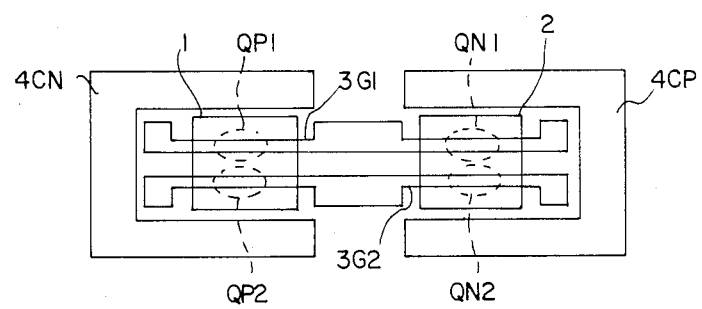
FIG. 2 is a bulk pattern of a prior art basic cell.
Figure 3:
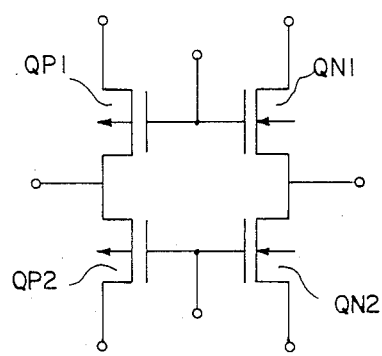
FIG. 3 is an equivalent circuit diagram of the basic cell of FIG. 2.
Figure 7:
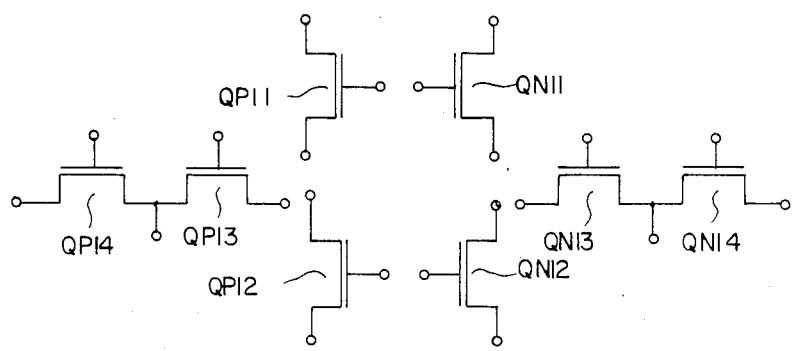
FIG. 7 is an equivalent circuit diagram corresponding to the bulk pattern of FIG. 6.

FIG. 7 is an equivalent circuit diagram of the bulk pattern shown in FIG. 6. The differences between the basic cell of FIGS. 6 and 7 and the conventional basic cell of FIGS. 2 and 3 are as follows: (1) in the basic cell shown in FIGS. 6 and 7, the p-channel transistors QP11 and QP12, and n-channel transistor QN11 and QN12 are electrically independent from each, i.e., the p-channel and n-channel transistors in a basic cell do not have common gates, common sources or common drains; (2) each of the gate electrodes of the transistors QP11, QP12, QN11 and QN12 extends along the periphery of the respective p-type or n-type region to the respective extended terminal portions 17A, 18A, 21A and 22A which are formed in parallel to respective electrodes 17, 18, 21 and 22; and (3) the second p-channel transistor region RP2, providing the additional p-channel transistors, is provided adjacent to the first p-channel transistor region RP1, and the second n-channel transistor region RN2, providing the additional n-channel transistors, is provided adjacent to the first n-channel transistor region RN1.

Figure 8:
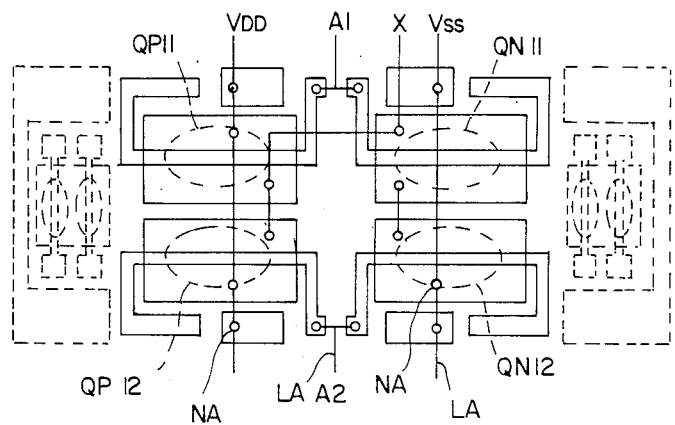
FIG. 8 is a bulk pattern of a 2-input NAND gate circuit formed using the basic cell shown in FIGS. 6 and 7.
Figure 9:
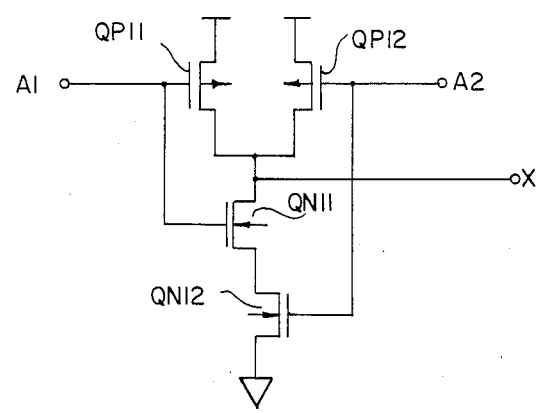
FIG. 9 is an equivalent circuit diagram of the bulk pattern of the 2-input NAND gate circuit shown in FIG. 8.

FIG. 8 is a plan view illustrating a bulk pattern and the electrical connections thereon forming a 2-input NAND gate circuit in the basic cell of FIGS. 6 and 7, and FIG. 9 is an equivalent circuit diagram of the 2-input NAND gate circuit. As shown in FIG. 8, the NAND gate circuit uses the p-channel transistors QP11 and QP12 and n-channel transistors QN11 and QN12 in a single basic cell of the present invention. Each of the wiring lines (thick solid lines) laid over the basic cell for interconnecting the transistors in the basic cell has contacts formed at the positions indicated by the small circles NA. In the interconnection of a masterslice, a double-layer of aluminum metallization is used. Since the wiring lines in FIG. 8 do not cross each other, the wiring can be accomplished using only the first aluminum layer. A1 and A2 are input signal lines, X is an output signal line, and VDD and VSS represent lines which supply a positive negative potential, respectively. The portions of FIG. 8 not having reference characters for identification are the same as in FIG. 6. The areas occupied by the additional transistors and corresponding contact regions (as indicated by the dashed lines) in FIG. 8 are not used by the NAND gate circuit, and can be utilized for distributing wiring lines as in the conventional masterslice semiconductor device.

As described above, the basic cell according to the present invention can be used as a conventional basic cell as shown in FIG. 3. However, additional advantages provided by the basic cell of the present invention will be described more fully in the following.

Figure 10:
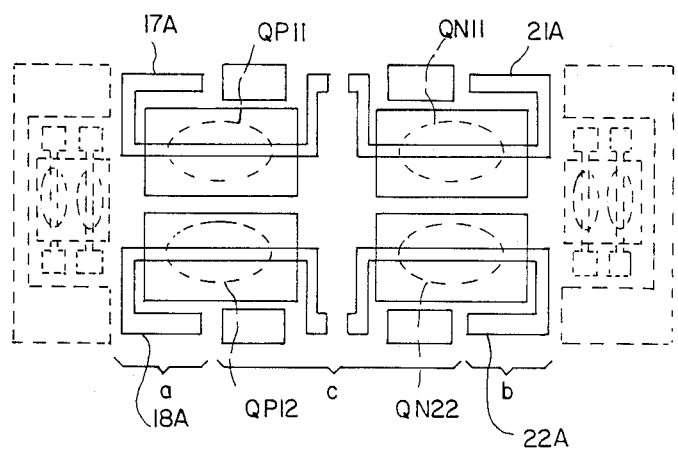
FIG. 10 is a layout of the basic cell according to the present invention for explaining advantages resulting therefrom.

For the purposes of this discussion, the basic cell of the present invention is divided into three regions (a), (b) and (c) as shown in FIG. 10, which is a reproduction of the bulk pattern of the basic cell shown in FIG. 6. In the region (a), the terminal portions 17A and 18A and the source and drain regions of the p-channel transistors QP11 and QP12 of every basic cell are provided in the column direction of the basic cell array and overlap. In the region (b), the terminal portions 21A and 22A and the source and drain regions of the n-channel transistors QN11 and QN12 of every basic cell are similarly provided with an overlap in the column direction. This feature facilitates the construction of a large scale unit cell within a basic cell array.

An example of a large scale unit cell is one organized by interconnecting small scale unit cells, such as a 2-input NAND gate circuit or a 2-input NOR gate circuit with use of aluminum wiring lines, where each of the small scale unit cells is formed from a basic cell within a basic cell array. Such a small scale unit cell is referred to as sub-block, hereinafter. The number of interconnecting lines between the small scale unit cells increases as the range of a large scale unit cell expands.

Referring back to FIGS. 2 and 3, in the conventional basic cell, the interconnection between the sources or drains of transistors in different basic cells must be selected from among channels for straight wiring lines passing through the relevant sources or drains. However, the contact points of a wiring line for the gate electrode of the transistors QP1, QP2, QN1 and QN2 number only two for each pair of transistors; i.e., the tabs at each end of the gate electrode for each pair of transistors. Furthermore, because the tabs are not arranged on a line passing in a column direction through the source or drain regions of any transistors in the basic cell array, the interconnection between a gate electrode and a source or drain region cannot be straight but must be a folded line. As a result of this restriction on the connections to the gate electrodes, a large number of the available wiring line channels in the region between adjacent basic cell arrays are used to interconnect a bare unit cell, and as a result, the number of channels available for inteconnection among unit cells is small. In other words, the scale of a unit cell, that is, the degree of the complexity of a circuit in a unit cell, is restricted by the number of the wiring channels available for interconnecting the unit cells.

In contrast, in the basic cell of the present invention, a sub-block, such as 2-input NAND gate circuit or 2-input NOR gate circuit, can be formed by distributing the wiring lines within region (c) of the basic cell, as shown in FIGS. 8 and 10, and the interconnecting lines among neighboring sub-blocks can also be laid in region (c). For interconnections ranging over a large scale unit cell, wiring channels are also available in the regions (a) and/or (b). That is, as already mentioned above, a number of straight wiring lines formed in the region (a) or (b) can directly interconnect the gates and/or sources or drains of any transistors they pass over. Due to the ability to make straight interconnections in the regions (a) and (b), the number of actually used wiring channels in column direction is decreased as compared to the number of wiring channels in an equivalent unit cell formed from the conventional basic cells as shown in FIG. 3. This reduction results because interconnection by a straight wiring line is rare in a unit cell using conventional basic cells and almost all wiring lines must have a bent or folded shape; i.e., the wiring line must be displaced along the row direction. This situation will be explained in more detail with reference to FIGS. 11 and 12.

Figure 11:
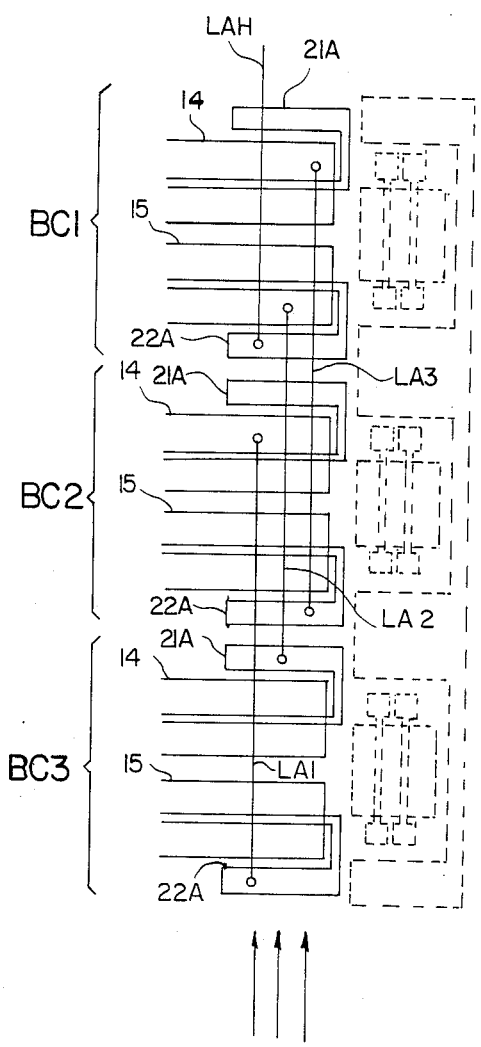
FIG. 11 is a right-hand portion of a basic cell array comprising basic cells of the present invention.
Figure 12:
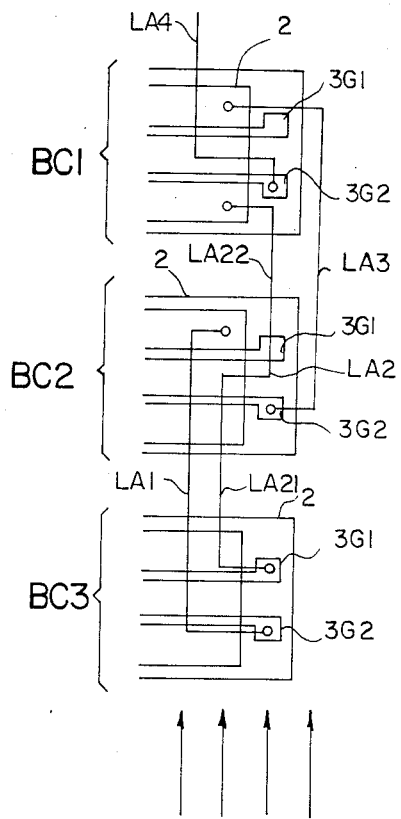
FIG. 12 is a right-hand portion of a basic cell array comprising the conventional basic cells shown in FIG. 3.

FIGS. 11 and 12 are both partial plan views illustrating the right side portions of basic cell arrays formed from the basic cells of the present invention (FIG. 11) and from the conventional basic cells (FIG. 12). In FIGS. 11 and 12, each of the arrow-headed lines indicates a wiring channel in the column direction. The number of the channels used in FIG. 11 is three while the number used in FIG. 12 is four. As mentioned above, in the basic cell array formed from the conventional basic cells, each wiring line interconnecting a gate electrode and a source or drain region cannot avoid having a bent shape, as shown in FIG. 12. This results in the wiring line LA2 between the source or drain region 2 in the basic cell BC1 and the gate electrode 3G1 in the basic cell BC3 occupying two wiring channels, as illustrated by the segments LA21 and LA22. As a result, the number of needed wiring channels is larger than the number of interconnecting lines. In contrast, as shown in FIG. 11, the straight interconnecting line structure provided in the basic cells of the present invention requires three wiring channels which is equal to the number of interconnecting lines.

The basic cells according to the present invention have a larger dimension in the column direction than that of the conventional basic cells, because each of the transistors in the basic cell is formed as electrically independent from the others. That is, the reason for the larger dimension of the basic cells of the present invention is due to the provision of a separate region for the source and drain for each of the transistors in the basic cell, and not due to the extended structure of the gate electrode. Therefore, if the circuits in all unit cells in a masterslice semiconductor device comprise plural pairs of transistors, each of the pairs having a single common source or drain, like the 2-input NAND gate circuit shown in FIGS. 8 and 9, the integration density of transistors of a semiconductor substrate can be the same as that in the prior art, and the advantage of the extended structure of the gate electrode is maintained.

Figure 13:
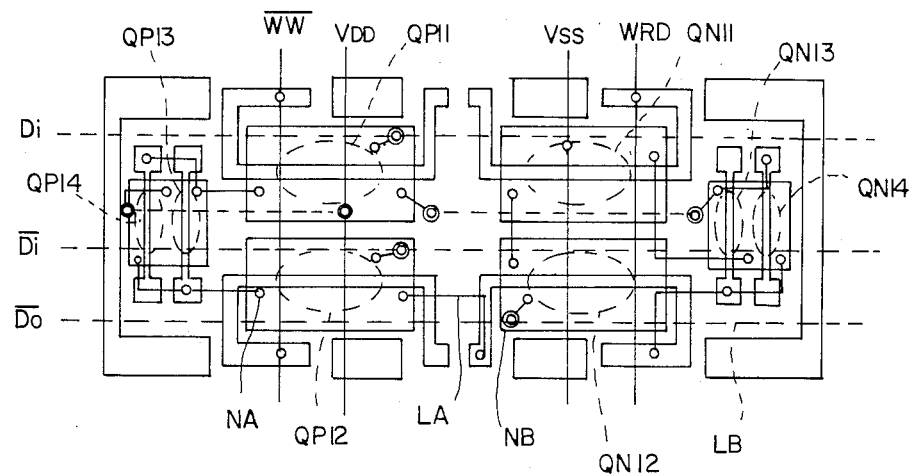
FIG. 13 is a bulk pattern of a RAM cell formed using the basic cell shown in FIG. 6.
Figure 14:
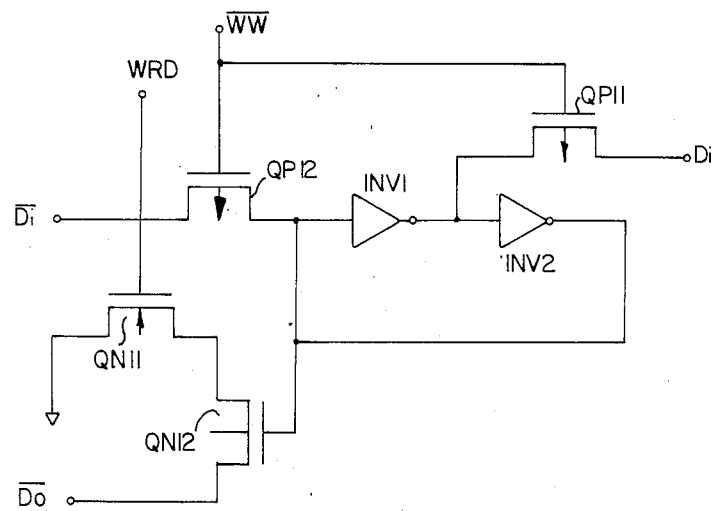
FIG. 14 is an equivalent circuit diagram of the bulk pattern of the RAM cell of FIG. 13.

FIG. 13 is a plan view illustating a bulk pattern and wiring layout of a RAM cell using the basic cell of FIG. 6, and FIG. 14 is an equivalent circuit diagram of the RAM cell of FIG. 13. Wiring lines LA (indicated by thick solid lines) are fabricated from the first layer of a double-layer aluminum metallization and have contacts formed at each point indicated by a small circle, while the wiring lines LB (indicated by thick dashed lines) are fabricated from the second layer of the double-layer aluminum metallization and at each point indicated by doubled-circle contacts are formed via a through-hole in the insulating layer therebetween. Di, $\overline{Di}$ and $\overline{Do}$ indicate input signal lines, inverted input signal lines and inverted output signal lines, WRD and $\overline{WW}$, respectively, indicate the word line for read-out and the word line for input, and VDD and VSS represent lines supplying positive and negative potentials, respectively. The inverter INV1 in FIG. 14 is formed from the additional transistors QP13 and QN13 in FIG. 13, and INV2 in FIG. 14 is formed from the additional transistors QP14 and QN14 in FIG. 13. As is obvious from FIG. 13, the RAM cell can be formed in a single basic cell according to the present invention, without resulting in any redundant transistors.

Figure 15:
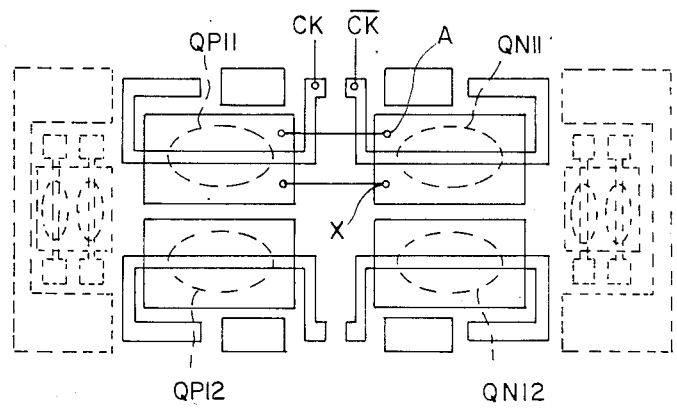
FIG. 15 is a bulk pattern of a transmission gate circuit formed in a basic cell of the present invention.
Figure 16:
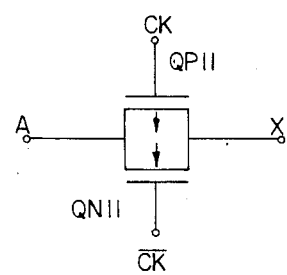
FIG. 16 is an equivalent circuit diagram of the bulk pattern of the transmission gate circuit formed in the basic cell of FIG. 15.

FIG. 15 is a plan view illustrating a bulk pattern and wiring layout of a transmission gate circuit using a basic cell of the present invention, as shown in FIG. 6, and FIG. 16 is an equivalent circuit diagram corresponding to the transmission gate circuit formed in the basic cell shown in FIG. 15. In FIGS. 15 and 16, the reference characters A, X, CK and $\overline{CK}$ denote input signals, output signals, clock signals and inverted clock signals, respectively. As shown in FIG. 15, a transmission gate circuit is formed using the p-channel transistor QP11 and n-channel transistor QN11. Another transmission gate circuit can be formed using the p-channel transistor QP12 and n-channel transistor QN12. Both transmission gate circuits formed in the single basic cell can be operated independent from each other, which is different from those formed using the conventional basic cell.

Figure 17:
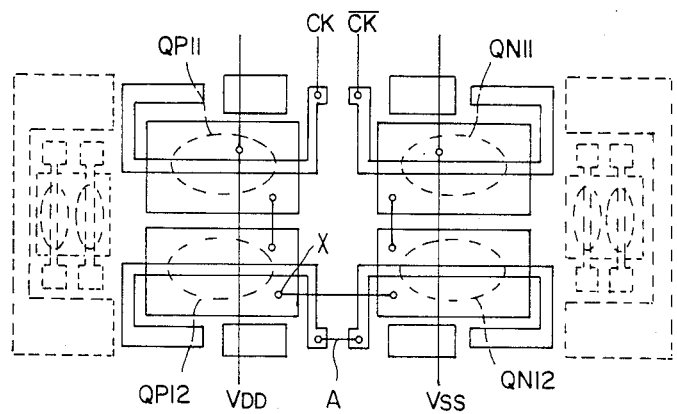
FIG. 17 is a bulk pattern of a clocked gate circuit formed in a basic cell of the present invention.
Figure 18:
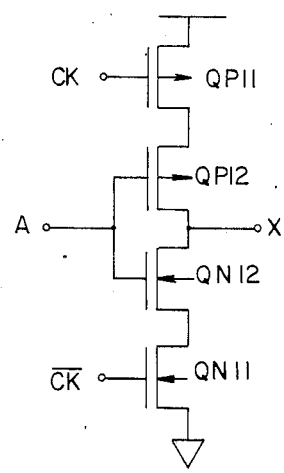
FIG. 18 is an equivalent circuit diagram of the bulk pattern of the clocked gate circuit of FIG. 18.

FIG. 17 is a plan view illustrating a bulk pattern and wiring layout of a clocked gate circuit where the equivalent circuit diagram is depicted in FIG. 18. In FIGS. 17 and 18, each of the reference characters designate like or corresponding parts as in the preceding figures. As shown in FIG. 17, the clocked gate circuit can be formed using a single basic cell, in contrast to the need for two conventional basic cells as shown in the FIG. 3 in the prior art masterslice semiconductor device which also results in redundant transistors.

The many features and advantages of the invention are apparent from the detailed specification and, thus, it is intended by the appended claims to cover all such features and advantages of the device which fall within the true spirit and scope of the invention. Further since numerous modifications and changes will readily occur to those skilled in the art, it is not desired to limit the invention to the exact construction and operation illustrated and described, and, accordingly, all suitable modifications and equivalents may be resorted to, falling within the scope of the invention. For example, the material for the gate electrode is not limited to polysilicon, a material such as a silicide of a metal having a high melting point can also be used. The entire region occupied by the additional transistors in any basic cell array can be used as the wiring region. In the row direction, the arrangement of the p-channel and n-channel transistors of the transistor pair in any basic cell of the present invention may be different between basic cell arrays, and the arrangement of the additional p-channel and n-channel transistors with respect to the transistor pair or pairs may also be different, provided that the regularity of the arrangements are maintained within each basic cell array. For instance, in a basic cell array, all of the p-channel transistors can occupy the left-hand side facing n-channel transistors in the next array, while, in any of the other basic cell arrays, the arrangement can be reversed.

We claim:

1. A masterslice semiconductor device comprising an array of basic cells, each basic cell including:
   a transistor having an elongated generally rectangular source region, and an elongated generally rectangular drain region spaced from said source region, said source region and said drain region each having longer sides and shorter ends, and an elongated gate electrode overlying the space between said source region and said drain region; and
   a terminal having a first portion connected to said gate electrode, extending from the gate electrode in the plane of the gate electrode beyond one pair of the ends of the source and drain regions, having a second portion extending from the first portion parallel to said ends beyond the respective side of one of the source and drain regions, and a third portion extending parallel to the elongated gate electrode and adjacent to said respective side, said third portion providing a terminal connection portion in alignment with said source and drain regions.

2. A masterslice semiconductor device as recited in claim 1, further comprising a connection tab connected to said gate electrode on an end of the gate electrode opposite the first portion of said terminal, said connection tab being suitable for a connecting point.

3. A masterslice semiconductor device as recited in claim 1, wherein each basic cell includes a first pair of said transistors and said terminals formed adjacent to each other having gate electrodes aligned with each other along a row direction.

4. A masterslice semiconductor device as recited in claim 3, wherein the gate of each transistor in said first pair of transistors is electrically disconnected from the gate in the other transistor of said first pair.

5. A masterslice semiconductor device as recited in claim 3, wherein each basic cell further comprises:
   a second pair of transistors each respectively formed adjacent to and in parallel with the transistors of said first pair and having gate electrodes, and said first and second pairs having longitudinal ends;
   a third pair of transistors formed parallel to each other, adjacent to the longitudinal ends of said first and second pairs, and having gate electrodes extending perpendicular to the gate electrodes of said first and second pairs; and
   a fourth pair of transistors formed parallel to each other, adjacent to the other longitudinal end of said first and second pairs, and having gate electrodes extending perpendicular to the gate electrodes of said first and second pairs.

6. A masterslice semiconductor device as recited in claim 3, wherein each basic cell includes a first pair of transistors formed adjacent to each other and having gate electrodes aligned with each other along a row direction.

7. A masterslice semiconductor device as recited in claim 6, wherein each basic cell further comprises:
   a second pair of transistors each respectively formed adjacent to and in parallel with the transistors of said first pair and having gate electrodes, and said first and second pairs having longitudinal ends;
   a third pair of transistors formed parallel to each other, adjacent to the longitudinal end of said first and second pairs, and having gate electrodes extending perpendicular to the gate electrodes of said first and second pairs; and
   a fourth pair of transistors formed parallel to each other, adjacent to the other longitudinal end of said first and second pairs, and having gate electrodes extending perpendicular to the gate electrodes of said first and second pairs.

8. A masterslice semiconductor device as recited in claim 3, wherein an end of the gate electrodes opposite the terminal portion of each transistor in each pair includes a connecting tab facing the other transistor in the pair and suitable for a connecting point.

9. A masterslice semiconductor device as recited in claim 1, wherein the third portion of said terminal provides sufficient area for several contacts.

10. A basic cell as recited in claim 1, further comprising:
    a tab terminal connected to and extending from the gate electrode opposite to the first portion of said terminal and perpendicular to the gate electrode; and
    a tab connected to and extending from said tab terminal and having an area sufficient to allow a connection contact.

* * * * *

UNITED STATES PATENT AND TRADEMARK OFFICE
CERTIFICATE OF CORRECTION

PATENT NO. : 4,668,972

DATED : May 26, 1987

INVENTOR(S) : Shinji Sato et al.

It is certified that error appears in the above-identified patent and that said Letters Patent is hereby corrected as shown below:

ON THE TITLE PAGE, ITEM [73] should read

-- Fujitsu Limited, Kawasaki, Japan --.

Column 1, line 26, "4,412,1237" should read -- 4,412,237 --.

Column 10, line 12, "3" should read -- 2 --.

Signed and Sealed this

Eighth Day of December, 1987

Attest:

DONALD J. QUIGG

*Attesting Officer*  *Commissioner of Patents and Trademarks*